(12) United States Patent
Noorlag et al.

(10) Patent No.: US 9,535,473 B2
(45) Date of Patent: Jan. 3, 2017

(54) COMPENSATING FOR AGING IN INTEGRATED CIRCUITS

(75) Inventors: Date Jan Willem Noorlag, Fremont, CA (US); Michael Frank, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1188 days.

(21) Appl. No.: 13/551,264

(22) Filed: Jul. 17, 2012

(65) Prior Publication Data

US 2014/0022008 A1 Jan. 23, 2014

Related U.S. Application Data

(62) Division of application No. 12/610,150, filed on Oct. 30, 2009, now Pat. No. 8,248,095.

(51) Int. Cl.
| H03H 11/40 | (2006.01) |
| H03K 3/03 | (2006.01) |
| G06F 1/26 | (2006.01) |
| G01R 31/28 | (2006.01) |
| G01R 31/30 | (2006.01) |

(52) U.S. Cl.
CPC ............. *G06F 1/26* (2013.01); *G01R 31/2856* (2013.01); *G01R 31/3004* (2013.01)

(58) Field of Classification Search
CPC .... G06F 1/26; G01R 31/2856; G01R 31/3004
USPC .............................. 324/537; 327/524; 331/57
See application file for complete search history.

(56) References Cited

U.S. PATENT DOCUMENTS

| 6,999,051 | B2 | 2/2006 | Hsu |
| 7,471,161 | B2 | 12/2008 | Liu |
| 7,504,847 | B2 | 3/2009 | Goodnow et al. |
| 7,592,876 | B2 | 9/2009 | Newman |
| 7,652,317 | B2 | 1/2010 | Watanabe |
| 2005/0134394 | A1* | 6/2005 | Liu .................. G01R 31/31727 331/57 |
| 2011/0102064 | A1* | 5/2011 | Noorlag ........... H03K 19/00384 327/524 |

* cited by examiner

*Primary Examiner* — Farhana Hoque
(74) *Attorney, Agent, or Firm* — Meyertons, Hood, Kivlin, Kowert & Goetzel, P.C.; Erik A. Heter

(57) ABSTRACT

An age compensation method and apparatus for an integrated circuit (IC). An IC may be configured to operate at an initial operating voltage at the beginning of its operational life. Various circuits may be used to detect aging of the IC, and indications of aging may be stored to determine the aging of the IC. The information indicative of the determined aging of the IC may be compared to an aging threshold. If the information indicates that the aging is greater than or equal to the determined aging threshold, the operating voltage of the IC may be increased. This process may be repeated over the life of the IC, increasing the operating voltage as the IC ages. Raising the operating voltage in response to aging may compensate for various age related degradation mechanisms that can occur over the operational life of the IC.

15 Claims, 8 Drawing Sheets

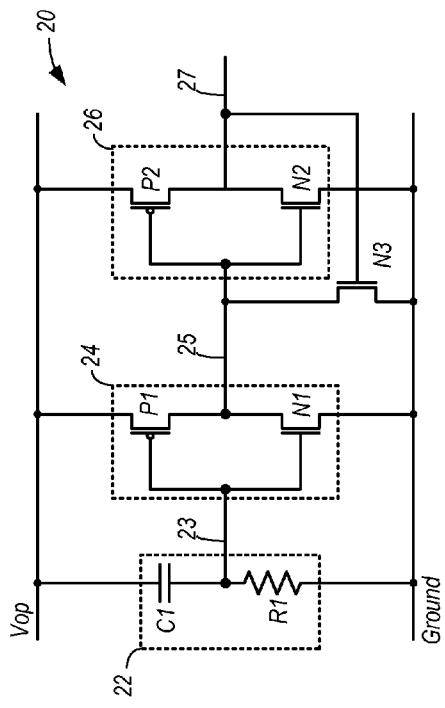
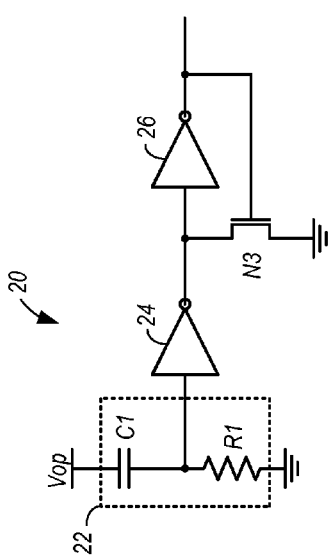
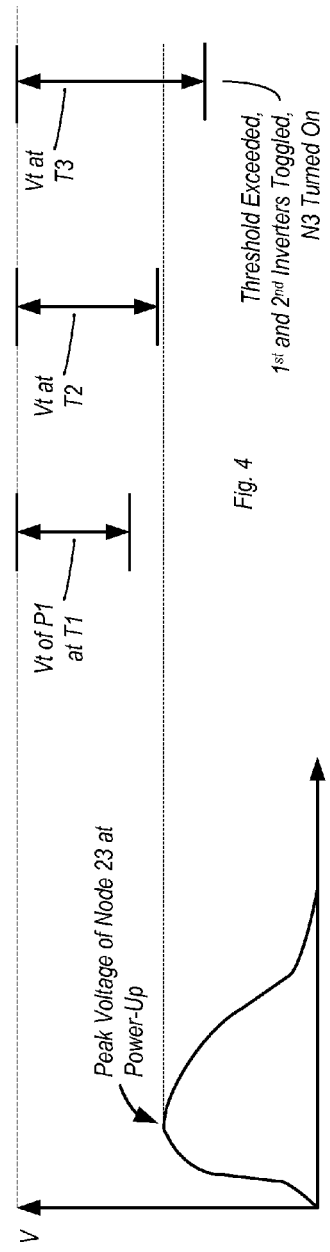
Fig. 2
Fig. 3
Fig. 4

COMPENSATING FOR AGING IN INTEGRATED CIRCUITS

PRIORITY INFORMATION

The present application is a divisional of U.S. application Ser. No. 12/610,150, titled "Compensating for Aging in Integrated Circuits", filed on Oct. 30, 2009, now U.S. Pat. No. 8,248,095, issued Aug. 21, 2012, which is hereby incorporated by reference in its entirety as though fully and completely set forth herein.

BACKGROUND

Field of the Invention

This invention relates to electronic circuits, and more particularly, to methods and mechanisms to compensate for the aging of the electronic circuits.

Description of the Related Art

Over the life an electronic circuit, the effects of aging may have an impact on its operation. Factors such as operating time, voltage, and temperature may change one or more characteristics of various circuit elements. For example, the threshold voltage of a transistor may change over the operating life of an integrated circuit (IC) in which it is implemented. A change in the threshold voltage of one or more transistors may in turn require a change in the supply voltage supplied to the IC. Generally speaking, an increase in the absolute value of a threshold voltage of one or more transistors in an IC may correspond to an increase in the required supply voltage for correct operation.

One common degradation mechanism that manifests itself during the aging of transistors in electronic circuits is negative bias temperature instability (NBTI), which may apply to PMOS (p-channel metal oxide semiconductor) transistors. The affects on a PMOS transistor of NBTI over a period of time may cause an increase in the absolute value of the threshold voltage, along with a decrease in drain current and transconductance. As the absolute value of the transistor's threshold voltage increase over time, a higher supply voltage value is required to ensure that the circuit operates properly. A similar phenomenon, positive bias temperature stability (PBTI) may affect NMOS (n-channel metal oxide semiconductor) transistors. Another potential degradation mechanism is hot carrier injection (HCI), wherein electrons or holes may gain sufficient kinetic energy to overcome barriers between different portions of the silicon (e.g., the barrier between the silicon substrate and the gate dielectric). Higher operating temperatures may exacerbate HCI, as the higher temperatures may be associated with higher amounts of kinetic energy in the electrons/holes. Over time, HCI may degrade the gate dielectric of a transistor, increase its sub-threshold leakage current, and may also shift the threshold voltage.

In order to compensate for the effects of aging, IC's may be operated at a supply voltage that includes a guard band. For example, if the transistors of a given IC require a minimum supply voltage of 900 mV for correct operation, the IC may be operated at 1 V. Thus, as the degradation mechanisms discussed above cause an increase in the minimum required supply voltage, the guard band may provide protection against erroneous operation.

SUMMARY

An age compensation method and apparatus for an integrated circuit (IC) is disclosed. In one embodiment, an aging compensation method may be used to compensate for the aging of the IC. The IC may be configured to operate at an initial operating voltage at the beginning of its operational life. Various circuits may be used to detect aging of the IC, and indications of aging may be stored to determine the aging of the IC. The information indicative of the determined aging of the IC may be compared to an aging threshold. If the information indicates that the aging is greater than or equal to the determined aging threshold, the operating voltage of the IC may be increased. This process may be repeated over the life of the IC, increasing the operating voltage as the IC ages. Raising the operating voltage in response to aging may compensate for various age related degradation mechanisms that can occur over the operational life of the IC.

In one embodiment, an IC may include one or more aging detection circuits configured to monitor the aging of the IC. The information provided by the aging detection circuits may be stored in a memory, and may be queried to determine an approximate age of the IC. The determined age of the IC may be compared to an aging threshold. If determined age of the IC is equal to or greater than the aging threshold, a new operating voltage may be selected. The new operating voltage may be greater than the current operating voltage. Information indicative of the new operating voltage may also be written into a non-volatile memory. During a subsequent boot-up procedure, the operating voltage information may be read from the non-volatile memory, and may be used to cause the IC to be operated at the indicated operating voltage.

Compensation for aging of the IC may be performed by hardware and/or software. In one embodiment, an IC may include a power control unit configured to read one or more indications of aging from a register or other type of memory. The power control unit may utilize the indications of aging to determine the aging of the IC, and may compare the aging against an aging threshold in order to determine if the operating voltage should be increased. The power control unit may also write information indicative new operating voltage to a non-volatile memory should it determine that the operating voltage is to be increased.

In another embodiment, a computer readable storage medium may store instructions executable by a computer system in order to implement an age compensation apparatus. When executed on a computer system, the instructions may cause the reading of indications of aging from a register or other type of storage unit. Further instructions may be executed to determine the aging of the IC based on the one or more indications, and to determine a desired operating voltage based on the aging. Instructions may also be executed to cause the operating voltage to be changed if the current and desired operating voltages are not equal, as well as to write information indicative of the operating voltage into a non-volatile memory, for use during a system start-up sequence.

BRIEF DESCRIPTION OF THE DRAWINGS

The following detailed description makes reference to the accompanying drawings, which are now briefly described.

FIG. 2 is a logic diagram of one embodiment of an aging detection circuit.

FIG. 3 is schematic diagram of one embodiment of an aging detection circuit.

FIG. 4 is a graphic illustrating the functioning of one embodiment of an aging detection circuit over time.

Figure 1:
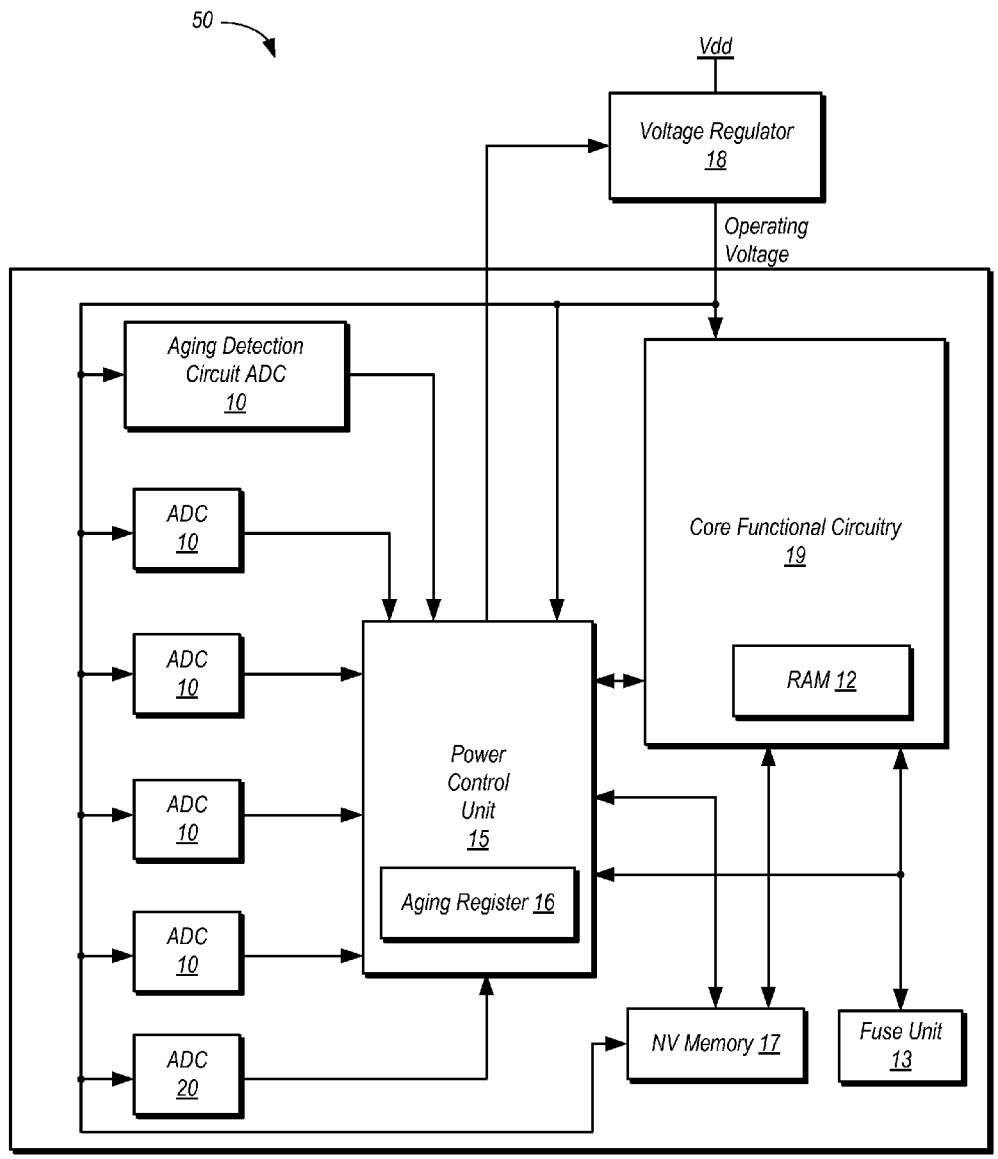
FIG. 1 is a block diagram of one embodiment of an integrated circuit (IC) having an age compensation apparatus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit:

Turning now to FIG. 1, a block diagram of one embodiment of an integrated circuit (IC) 50 is illustrated. In the embodiment shown, IC 50 includes a plurality of aging detection circuits (ADC's) 10 and 20, a power control unit 15, a non-volatile (NV) memory 17, and core functional circuitry 19. The core functional circuitry may be that circuitry that is configured to perform the intended functions of IC 50. IC 50 may also be coupled to, or may include, a voltage regulator 18 coupled to receive a supply voltage and configured to provide an operating voltage. Voltage regulator 18 may be a variable voltage regulator, in which the operating voltage provided thereby may be adjusted.

IC 50 may be one of a number of different types of integrated circuits. For example, IC 50 may be a system on a chip (SOC), incorporating a number of different functions, including processing functions, memory, I/O functions, and other types of functions associated with SOC's. In another embodiment, IC 50 may be a discrete processor, or other discrete component IC such as a bridge, an I/O component, etc. used in a computer system (e.g., in a desktop or laptop computer). IC 50 may also be an application specific integrated circuit (ASIC). Generally speaking IC 50 may be any type of IC, and may include analog and/or digital circuitry.

As previously noted, IC 50 includes a plurality of aging detection circuits (ADC's) 10 and at least one ADC 20, which may be a variation of ADC 10. The ADC's 10 and 20 may be various types of circuits used to detect aging of IC 50. In some embodiments, each ADC 10 may be a ring oscillator, or a counter. Aging may be detected via variations in the frequency of the ring oscillator over time, for example. Embodiments wherein each of ADC's 10 is the same or similar type of circuit to ADC 20 are also possible and contemplated. Further embodiments are also possible and contemplated wherein a variety of different types of circuits are used to detect aging are implemented. Embodiments of ADC 20 will be discussed in further detail below.

Each ADC 10 and ADC 20 in the embodiment shown is coupled to power control unit 15. Power control unit 15 may perform various power control functions, including adjustment of the supply voltage based on aging of IC 50. In the embodiment shown, each ADC 10 and 20 may provide respective indications of aging to an aging register 16 of power control unit 15. Aging register 16 may store the indications of aging in order to enable power control unit 15 to make a determination of the aging of IC 50. For example, each ADC 10 and 20 may be configured to provide a bit in a first state to indicate aging of that particular ADC 10/20 up to or beyond a certain threshold, and to provide a bit in a second (complementary) state to indicate that the ADC 10/20 has not aged up to the threshold. However, in other embodiments, particular ones of ADC 10 may provide other indications of aging to power control unit 15 (e.g., a count value, a frequency, etc.), which may then be converted into information storable in aging register 16.

Power control unit 15 in the embodiment shown is configured to determine the aging of IC 50 based on the indications stored in aging register 16. In some embodiments, each individual ADC 10/20 may be configured to provide indications of aging up to a threshold value different from other instances of ADC 10/20. For example, a first ADC 10 may provide an indication responsive to aging sufficiently to cross a first threshold, while a second ADC 10 may provide an indication responsive to aging sufficiently to cross a second threshold, wherein the aging associated with the second threshold is greater (e.g., more elapsed time) than the first threshold. Thus, based on reading the indications of aging stored in aging register 16, power control unit 15 may determine the aging of IC 50 (e.g., the approximate amount of operating time elapsed for IC 50, or the approximate amount of degradation that has occurred due to aging). In other embodiments, there may be no aging register 16. The power control unit 15 may directly operate on the inputs from the ADCs 10 and 20, for example.

Responsive to determining the aging of IC 50, power control unit 15 may compare a desired operating voltage for that level of aging to a current operating voltage. If the desired operating voltage and the current operating voltage are the same, power control unit 15 may refrain from performing any additional action. However, if the desired operating voltage is different from the current operating voltage, power control unit 15 may perform actions to cause IC 50 to subsequently change the operating voltage. For example, power control unit 15 may, responsive to determining that the desired and current operating voltages are different, write information to NV memory 17 indicative of the new (i.e. desired) operating voltage. During a subsequent boot-up of a system in which IC 50 is included, the NV memory 17 may be queried, and the operating voltage may be set based on the indicated value stored therein. In addition, power control unit 15 may be configured to provide signals to voltage regulator 18 to effect a change in the operating voltage provided to IC 50.

In the embodiment shown, IC 50 also includes a fuse unit 13. During an initial powering on of IC 50 (i.e. the very first time it is powered up), power control unit 15 may read information from fuse unit 13 to determine the initial operating voltage. This value may then be written into NV memory 17, and may also be used to set the initial operating voltage by providing signals indicating the same to voltage regulator 18. During subsequent start-ups of IC 50, the operating voltage value may be obtained by reading NV memory 17 or by determining the desired operating voltage based on aging as described above.

Increasing the operating voltage over the life of IC 50 may compensate for aging effects to which IC 50 may be subject. For example, various transistors may degrade over the life of IC 50, which may cause an increase in the magnitude of their respective threshold voltages. The increasing magnitude of one or more threshold voltages may necessitate operating IC 50 at a higher operating voltage, which may be put into effect as described above and elsewhere herein.

In addition to compensating for aging, the various embodiments of a method and apparatus described herein, including the above, may allow for lower initial operating voltages (i.e. the operating voltage at the beginning of life of IC 50). Since IC 50 is configured to compensate for aging having its operating voltage raised over time, the initial operating voltage may be specified without the need for a significant guard band to protect against the effects of aging. This may allow for a lower initial operating voltage than would otherwise be possible if a significant guard band was required. This lower initial operating voltage may in turn lead to a lower power consumption during the early life of the circuit. The lower initial operating voltage may also reduce the aging of the circuit, since many aging mechanisms are proportional to supply voltage magnitude, accelerating with higher voltages.

It should be noted that embodiments are possible and contemplated wherein some or all of the functions performed by power control 15 are performed by software instead of hardware. For example, software instructions may be executed to determine the aging of IC 50 based in the indications of aging provide by the ADC's 10/20, to write information indicative of a specified operating voltage value to NV memory 17, and to cause signals to be provided to voltage regulator 18 in order to set the operating voltage to that specified in NV memory 17. Software instructions may also be executed to designate a portion of a memory to store the indications of aging, in lieu of providing aging register 16 (e.g. within RAM 12 of core functional circuitry 19 in the illustrated embodiment).

It is noted that the ADCs 10 and 20 are illustrated for convenience in the block diagram of FIG. 1 as separate from the area occupied by other circuitry. However, in one embodiment, the ADCs 10 and 20 may be physically distributed over the surface of the integrated circuit 50 (including the areas occupied by the core functional circuitry 19, the power control unit 15, etc.).

Aging Detection Circuit and Operation:

FIG. 2 is a logic diagram of one embodiment of ADC 20. In the embodiment shown, ADC 20 includes a filter 22, first inverter 24, second inverter 26, and feedback transistor N3. Filter 22 in the embodiment shown is a high pass filter including capacitor C1 and resistor R1, although other types of filters (e.g., low pass or band pass) may be used as well. In some embodiments, filter 22 may be replaced by other circuitry, including circuitry that may mimic its behavior. Embodiments utilizing digital filters are also possible and contemplated. Furthermore, filter 22 may be replaced in some embodiments by an up/down counter coupled to a digital-to-analog converter (DAC) to generate the input voltage at the input of first inverter 22. In general, any suitable type of circuitry for generating a momentary input voltage on the input of inverter 24 may be used in various embodiments of ADC 20.

In the embodiment shown, filter 22 is configured such that when power is initially applied to node Vop (the operating voltage node), the voltage on the input of inverter 24 rises and then falls in a manner comparable shown in graph 21 of FIG. 4. This voltage may or may not rise to a level sufficient to change the output of inverter 24. The output of inverter 24 may be provided to the input of inverter 26. The output of inverter 26 may be provided to transistor N3, and may also be provided to other units, such as power control unit 15 as shown in FIG. 1. Inverter 26 and transistor N3 are arranged to form a half-latch circuit in the embodiment shown, wherein a change of the input/output state of inverter 26 to a logic one (high voltage) may be held via activation of transistor N3.

The state of the output of inverter 24 may depend both on the state of its input, as well as on the state of transistor N3. In the embodiment shown, if the input of inverter 24 is a logic 0 (e.g., a low voltage), then its output will be a logic 1 if transistor N3 is inactive. The logic 1 on the output from inverter 24 may be input into inverter 26, causing the output of inverter 26 to output a logic 0. The logic 0 (which is a low voltage in this example) may in turn cause transistor N3 to remain inactive. Furthermore, a logic 0 output by inverter 26 may indicate that ADC 20 has not detected aging up to at least a certain aging threshold. A logic 1 output by inverter 26 may indicate that ADC 20 has detected aging up to or beyond that threshold.

If the voltage on the input of inverter 24 rises sufficiently during the initial power up sequence (e.g. to the toggle point, or trip point, of the inverter), the output of inverter 24 may change states from a logic 1 to a logic 0. If the output of inverter 24 (and thus the input of inverter 26) changes to a logic 0, inverter 26 may respond by outputting a logic 1. The outputting of the logic 1 by inverter 26 may result in a gate voltage sufficient to turn on transistor N3. When transistor N3 is activated, a pull-down path may exist between the output node of inverter 24 and ground. Accordingly, the output of inverter 24 may be pulled down toward ground (and thus toward a logic 0), irrespective of the logic value on its input. The logic 0 on the output of inverter 24 may cause the output of inverter 26 to be a logic 1, thereby causing transistor N3 to remain active. Accordingly, the half-latch circuit formed by inverter 26 and transistor N3 in the embodiment of FIG. 2 is arranged such that once transistor N3 is active, the input and output states of inverter 26 may be held to the same values for the remainder of time that power is applied to ADC 20. As a result, even if the input of inverter 24 falls to a logic 0, the logic 0 output state of inverter 24 may be enforced by the activation of transistor N3.

FIG. 3 is schematic diagram that further illustrates an embodiment of ADC 20. In the embodiment shown, first inverter 24 includes a PMOS (p-channel metal oxide semiconductor) transistor P1 and an NMOS (n-channel metal oxide semiconductor) transistor N1. Transistor P1 in this embodiment includes a source terminal coupled to Vop, a drain terminal coupled to node 25, and a gate terminal coupled to node 23. Transistor N1 in this embodiment includes a drain terminal coupled to node 25, a source terminal coupled to ground, an a gate terminal coupled to node 23. Inverter 26 in the embodiment shown includes PMOS transistor P2 and NMOS transistor N2. Transistor P2 in this embodiment includes drain and source terminals coupled to node 27 and Vop, respectively, and a gate terminal coupled to node 25. Transistor N2 in this embodiment includes drain and source terminal coupled to node 27 and ground, respectively, and a gate terminal coupled to node 25. As with the embodiment of FIG. 2, a half-latch circuit is formed by inverter 26 and transistor N3. Transistor N3 in this embodiment includes gate, drain, and source terminals coupled to node 27, node 25, and ground, respectively. ADC 20 as shown in FIG. 3 also includes capacitor C1 and resistor R1 (coupled together at node 23), although as previously noted, other filter embodiments are possible and contemplated.

When a voltage equivalent to a logic 0 is provided to node 23 (i.e. the input node of inverter 24) in the embodiment shown, transistor P1 may be active while transistor N1 may be inactive. Accordingly, transistor P1 may remain active for nearly the entire time power is applied to ADC 20. When power is initially applied to ADC 20, a low voltage is present on the input of inverter 24, and thus transistor P1 may activate. If the initial voltage bump illustrated in graph 21 of FIG. 4 does not rise to a level sufficient to turn off transistor P1, it may thus remain active for the remainder of time that power is applied to ADC 20. Accordingly, transistor P1 may be subject to degradation mechanisms that occur with the aging of a PMOS transistor. In this particular example, transistor P1 may be subject to at least the degradation mechanism of negative bias temperature instability (NBTI). NBTI may cause the magnitude of the threshold voltage to increase over time, and this may affect whether or not P1 is turned off, at least momentarily, during a subsequent power on sequence.

When transistor P1 is on, a pull-up path between node 25 and Vop may be provided. If transistor N1 is turned off while P1 is on, then node 25 may be pulled up toward Vop. This may result in a logic 1 voltage present on node 25. As a result of the logic 1 voltage on node 25, transistor N2 of inverter 26 may be active, while transistor P2 may remain inactive. When active, transistor N2 may provide a pull-down path between node 27 and ground, thereby causing a logic 0 voltage to be present on that node. The logic 0 voltage present on node 27 may be insufficiently high to activate transistor N3.

If, during a power up sequence, the voltage present on node 23 rises sufficiently high, transistor P1 may be momentarily deactivated. Transistor N1 may become active, thereby providing a pull-down path between node 25 and ground. Accordingly, inverter 24 will have changed its input/output states, at least momentarily, as a logic 0 voltage may be present on node 25. As a result of the logic 0 voltage on node 25, transistor N2 may be deactivated, while transistor P2 may become active. The activation of transistor P2 may result in a pull-up path between node 27 and Vop, while the deactivation of transistor N2 may block the pull-down path between node 27 and ground. Accordingly, node 27 may be pulled up toward the operating voltage present on Vop, which results in a logic 1 voltage being driven by inverter 26. The logic 1 voltage may further be sufficient to cause the activation of transistor N3. The activation of transistor N3 may then create a pull-down path between node 25 and ground. This may effectively force a logic 0 voltage onto node 25, and thereby force a logic 1 voltage onto node 27. The logic 0 on node 25 and logic 1 on node 27 may be held for the remainder of time that power is provided to ADC 20.

After the voltage on node 23 falls again, transistor N1 may be deactivated, while transistor P1 may be activated again if not previously deactivated. However, if N3 is active, it may continue to drive a low voltage (and thus a logic 0) onto node 25, regardless of the state of transistor P1. In various embodiments, transistors N3 and P1 are sized relative to each other such that N3 has more drive strength than P1. In one example, the respective channel width/length ratios of N3 and P1 are sized such that N3 is at least twice as large as P1. Accordingly, when both N3 and P1 are active, node 25 may be driven to a low voltage, even though P1 is active, since the drive strength of transistor N3 is sufficient to overdrive that of transistor P1. Furthermore, when both N3 and P1 are active, a situation may exist wherein a logic 0 is present both on the input and output of inverter 24.

It should be noted that the circuits illustrated in FIGS. 2 and 3 are exemplary, and thus other embodiments are possible and contemplated. For example, circuit may be implemented using different types of transistors and different logic levels, while still falling within the general scope of the particular circuit embodiments discussed herein.

FIG. 4 is a graph illustrating an example of the operation for one embodiment of ADC 20 with respect to aging. As previously noted, graph 21 illustrates an approximation of the voltage present on node 23 during the initial application of power to ADC 20. When power is initially applied to ADC 20, the voltage on node 23 may rise up to a peak value, and may then subsequently fall, the duration of this rise and fall may be short in duration, but may be long enough to turn off transistor P1 depending on its threshold voltage. At time T1 during the life of the circuit (e.g., at the beginning of its operating life), the magnitude of the threshold voltage of transistor P1 is small enough that the voltage rise on node 23 is not sufficient to change its state from active to inactive. At time T2, later during the life of the ADC 20, the magnitude of the threshold voltage of P1 has increased due to degradation mechanisms incurred during its operation. However, at time T2, the magnitude of the threshold voltage has not increase enough to cause transistor P1 to deactivate during the power on sequence. However, at time T3 during the life of ADC 20, the magnitude of the threshold voltage has increased enough that the peak voltage on node 23 is sufficient to cause at least a momentary deactivation of transistor P1. The momentary deactivation may be accompanied by a momentary activation of transistor N1, thereby resulting in a logic 0 on node 25, a logic 1 on node 27, the activation of transistor N3, and the holding of node 25 to a logic 0 even after the voltage on node 23 falls enough to allow P1 to become active again.

Figure 5:
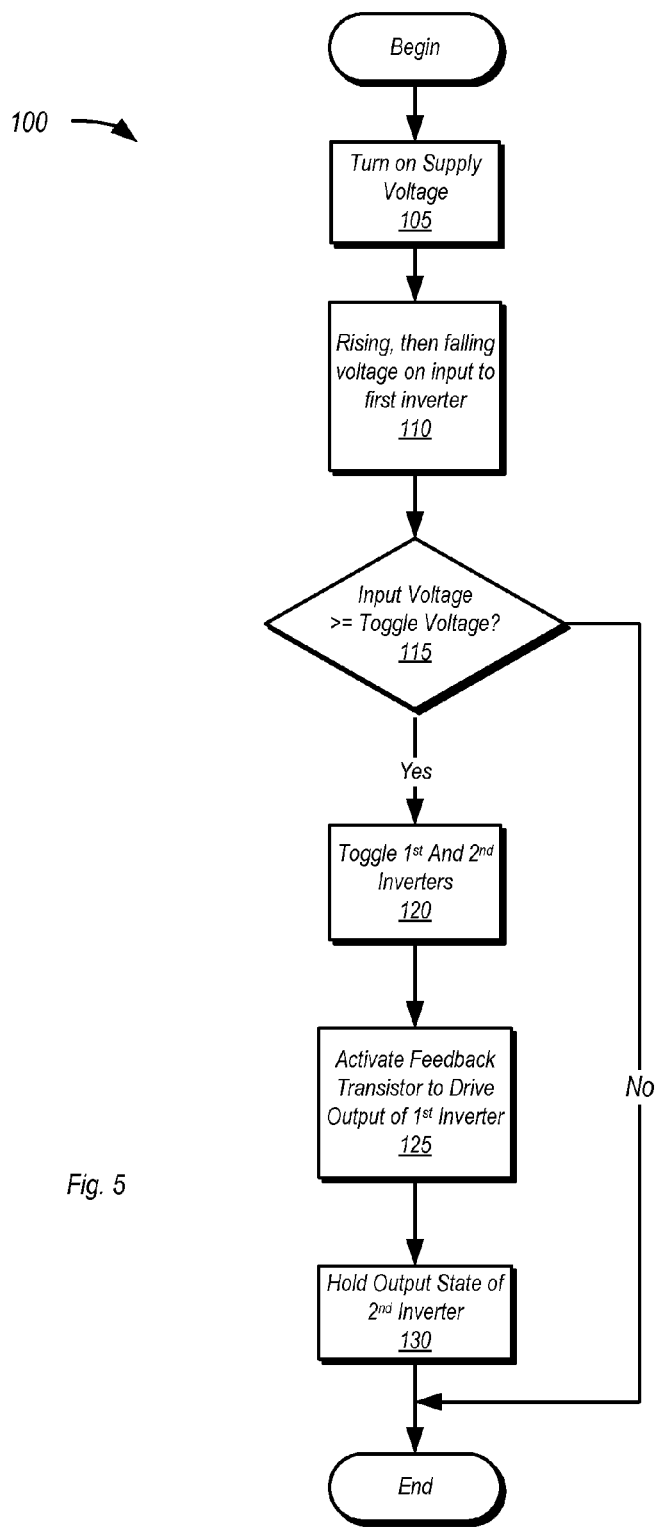
FIG. 5 is a flow diagram of one embodiment of a method for operating an aging circuit.

Turning now to FIG. 5, a flow diagram of one embodiment of a method for operating an aging circuit is shown. The operation of the circuit illustrated by FIG. 5 may apply to the circuit embodiments discussed with reference to FIGS. 2 and 3, although the illustrated method may apply to other embodiments as well. In the embodiment shown, method 100 begins with the turning on of a supply voltage (block 105). Responsive to the turning on of the supply voltage, the voltage on the input of a first inverter (e.g., on node 23 of FIG. 3) may rise and then subsequently fall (block 110), in a manner similar to that shown in graph 21 of FIG. 4.

In some cases, particularly when the circuit has not aged a certain amount, the voltage on the input of the first inverter may not rise to a level sufficient to toggle that inverter (block 115, no), and thus the output state of both inverters may remain unchanged. If, during this portion of the power-on sequence, the voltage on the input of the first inverter rises enough to change states (block 115, yes), both the first and second inverters may be toggled (i.e., their respective output states may be changed; block 120). For example, the output of the first inverter may fall to a logic 0, while the output of the second inverter may rise to a logic 1. This may lead to the activation of a feedback transistor (block 125), such as transistor N3 as shown in FIGS. 2 and 3. The activation of the feedback transistor may cause the output state of the $2^{nd}$ inverter to be held until power is no longer applied to the circuit (block 130). This may be accomplished by the feedback transistor driving the state of the input of the second inverter, which may include overdriving a state that the first inverter attempts to drive. For example, as the voltage on the input of the first inverter falls back toward ground, a PMOS transistor (e.g., P1 of FIG. 3) may re-activate and attempt to drive its output to a logic 1. However, the feedback transistor may be configured to have sufficient drive strength to overdrive the PMOS transistor of the first inverter, thus driving the output of the first inverter (and input of the second inverter) to a logic 0. It should be noted however, that the exemplary PMOS transistor discussed herein may remain active even if the feedback transistor is driving the first inverter output low.

Figure 6:
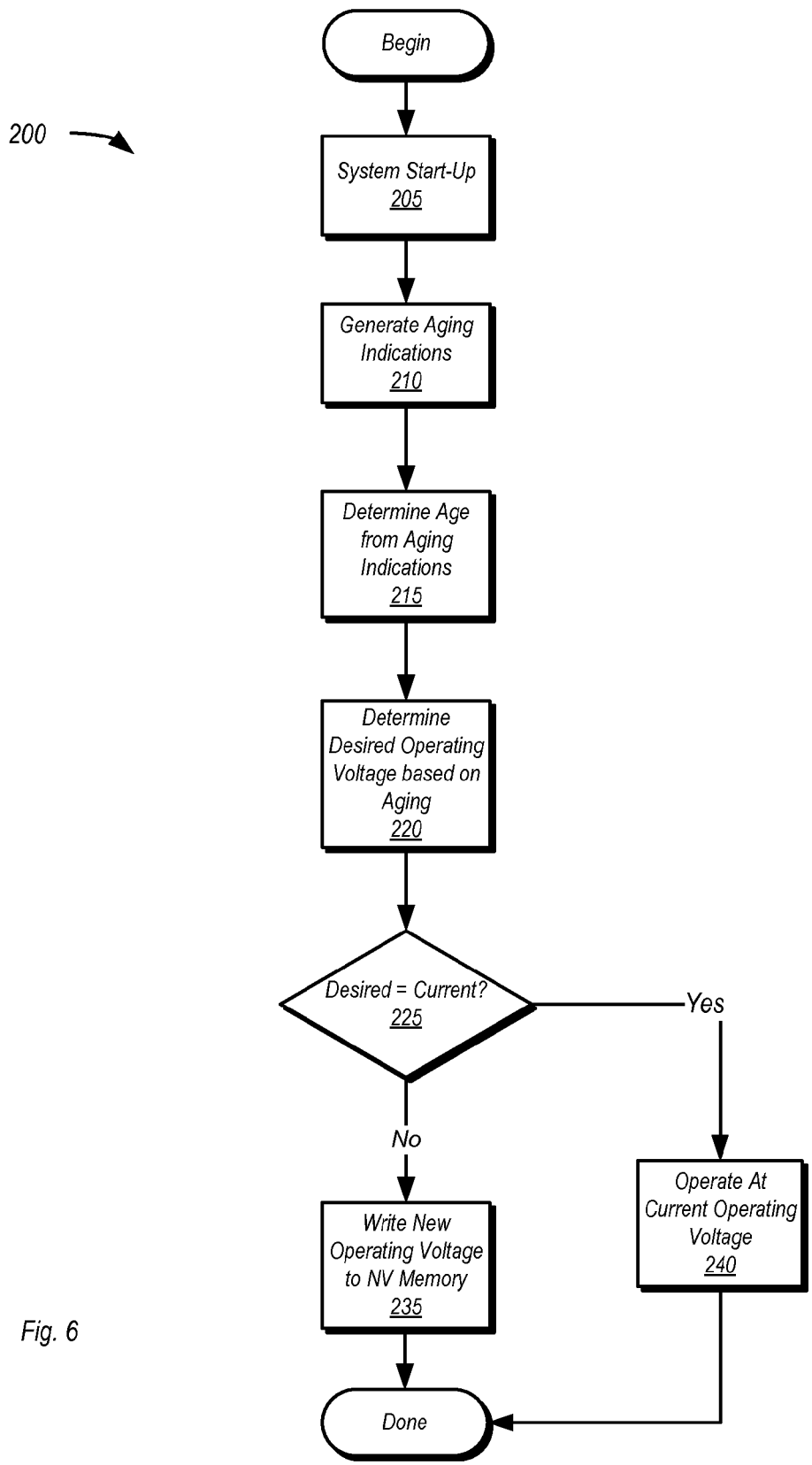
FIG. 6 is a flow diagram of one embodiment of a method for determining an operating voltage for an IC.

Age Compensation Methodology:

FIG. 6 is a flow diagram of one embodiment of a method for determining an operating voltage for an IC. More particular, FIG. 6 illustrates one embodiment of a method for adjusting an operating voltage of an IC to compensate for the effects of aging.

In the embodiment shown, method 200 begins with a system start-up routine being executed (block 205). The system start-up routine may include the application of power to the IC, as well as the performing of other functions. Responsive to applying power to the IC, one or more aging indications may be generated (block 210). Various types of circuits may be used to generate the aging indications, including those discussed above with reference to FIGS. 1-5. The indications of aging may indicate that a particular circuit has or has not shown effects of aging. For example, if an ADC 20 as discussed above provides a logic 0, it may indicate that it has not undergone a certain amount of aging, while a logic 1 provided by the same circuit may indicate that it has undergone a certain amount of aging.

After the indications of aging have been generated, the aging of the IC may be determined (block 215). The aging may be determined by taking an aggregate of the one or more aging indications. For example, consider an embodiment having ten instances of ADC 20 discussed in FIGS. 2 and 3. Transistors in these circuits may be sized such that different magnitudes of threshold voltage shift cause detection of aging by each circuit. That is, for example, a threshold voltage shift of 10 millivolts may be detected by one aging circuit, a threshold voltage shift of 20 millivolts may be detected by another aging circuit, etc. Accordingly, the number of instances of the aging detection circuit that detect aging may be an indication of the aging effects that have occurred. For example, if three of the ten instances are providing logic 1's, while the remaining seven are providing logic 0's, then approximately 30% of the detectable aging may have been detected. The more logic 1's that are detected from the ADCs 10 and 20, the greater the estimated aging effects are. Other embodiments may signal aging with a logic 0 rather than logic 1, if desired.

Once the aging of the IC has been determined, a desired operating voltage may also be determined (block 220). In various embodiments, different operating voltages may be associated with different levels of aging. For example, a first operating voltage may be associated with the beginning of operational life of the IC, a second operating voltage may be associated with a time after which one aging indication has been asserted, a third operating voltage may be associated with a time after two aging indications have been asserted, and so forth. Each successive operating voltage may be greater than the previous one, as the operating voltage may be increased to compensate for the aging of the IC and thus the circuitry therein. Thus, as the IC ages over its operational life, its operating voltage may be increased. The operating voltages to be provided in response to various levels of detected aging may be supplied to the IC 50 in any desired fashion. For example, a table may be accessible to the power control unit 15. A hardware table, programmable via software or fuses, may be provided. Alternatively, a software managed table stored in memory may be used. The operating voltage magnitudes for each detected age may be stored, or deltas to be added to an original voltage magnitude (e.g. from the fuse unit 13) may be stored, in various embodiments.

If the desired operating voltage is determined to be equivalent to the current operating voltage (block 225, yes), then the IC may continue operation at that particular voltage (block 240). However, if the desired operating voltage is not equivalent to the current operating voltage (block 225, no), then information indicative of the desired operating voltage may be written to a non-volatile (NV) memory (block 235). During a subsequent start-up (i.e. boot sequence) of the system, the NV memory may be queried for the information indicative of the stored voltage value, and the operating voltage for the IC may be set to this value. In some embodiments, block 235 may also involve changing the operating voltage of the IC at the time the determination is made, instead of waiting for a subsequent system start-up cycle to make such a change.

Figure 7:
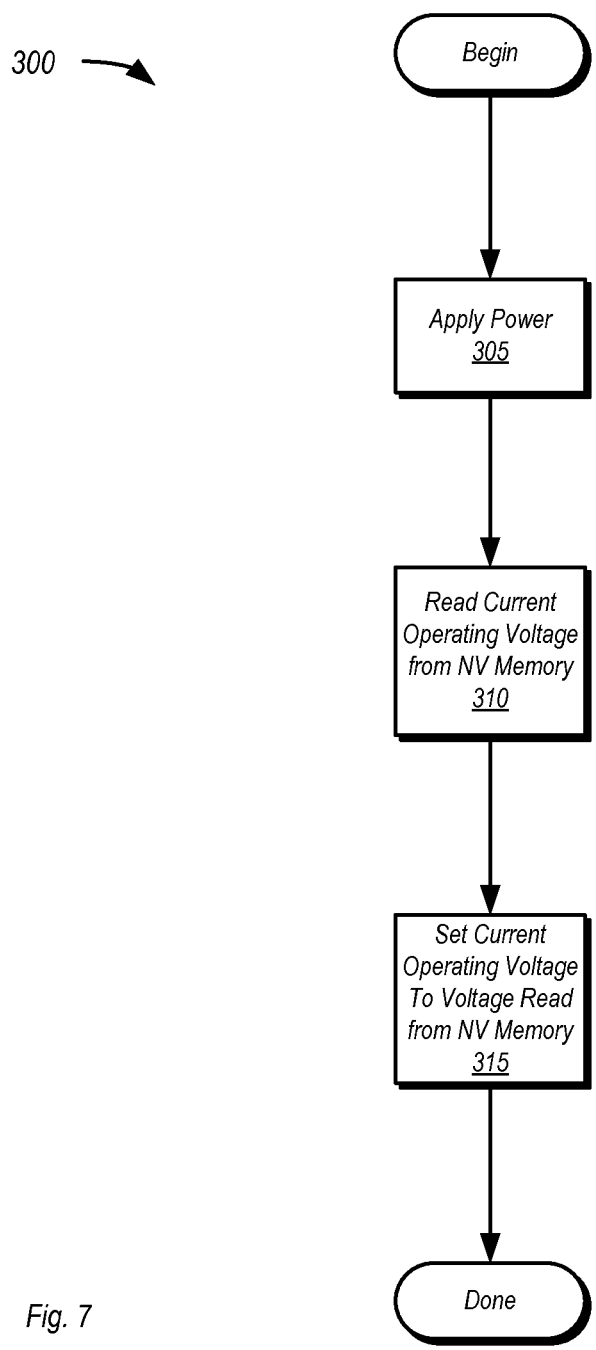
FIG. 7 is a flow diagram of one embodiment of a start-up sequence of an IC.

FIG. 7 is a flow diagram of one embodiment of a start-up sequence of an IC. The start up sequence illustrated in FIG. 7 may be one that occurs subsequent to an initial start-up of the IC. For example, method 300 may be applied to a start-up of an IC implemented in a system that has been used on previous occasions.

In the embodiment shown, method 300 begins with the application of power to the system (block 305). The application of power may initiate a boot-up sequence that may include determining an operating voltage for the IC. During the boot-up sequence, an operating voltage for the IC may be determined by reading information indicative thereof from an NV memory (block 310). The information indicating the operating voltage value in the NV memory may have been written during a previous cycle of operation. The indicated voltage may be an initial operating voltage, determined from reading fuses during an initial start-up of the IC, or may be an operating voltage determined based on a determination of aging of the IC. After the information has been read, the operating voltage of the IC may be set to the indicated voltage (block 315).

Figure 8:
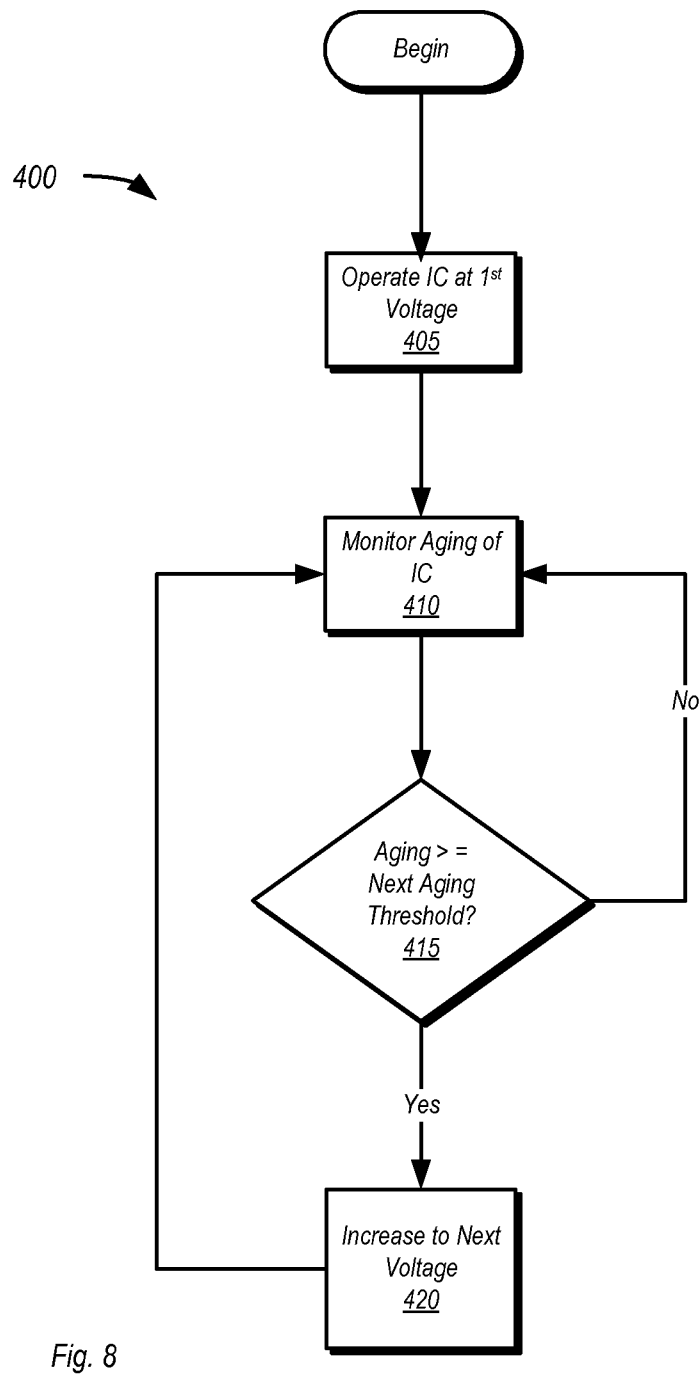
FIG. 8 is a flow diagram of one embodiment of a method for compensating for aging effects of the life of an IC.

FIG. 8 is a flow diagram of one embodiment of a method for compensating for aging effects of the life of an IC. In the embodiment shown, method 400 includes operating an IC at a first operating voltage (block 405). The first operating voltage may be the initial operating voltage at which the IC is operated, i.e. its beginning-of-life operating voltage. This voltage may be determined with a minimal guard band, since the method described herein may compensate for the aging of the IC over its life by raising the operating voltage as necessary. The first voltage referred to in block 405 may also be a subsequent operating voltage that is greater than the initial operating voltage.

Method 400 further includes monitoring the aging of the IC (block 410). Aging of the IC may be monitored using the various methods and mechanisms discussed above, including the use of the various ADC's 10/20 described in reference to FIG. 1. For example during each start-up of the IC subsequent to an initial start-up, indications of again may be checked to determine if aging has occurred and has made a higher operating voltage desirable. Any aging determined may be compared to an aging threshold, and if it is determined that aging has occurred up to or beyond a next aging threshold (415, yes), then the operating voltage of the IC may be increased. The increase of the operating voltage may compensate for the aging of the circuitry within the IC. If the aging is less than the next aging threshold (415, no), then the IC may continue operating at the current operating voltage while monitoring continues (block 410).

The method described above may be repeated for a number of different aging thresholds, and may thus implement a corresponding number of operating voltages. As the aging thresholds are successively met and exceeded over the life of the IC, the operating voltages may also be successively increased in order to compensate for the aging of the IC.

Figure 9:
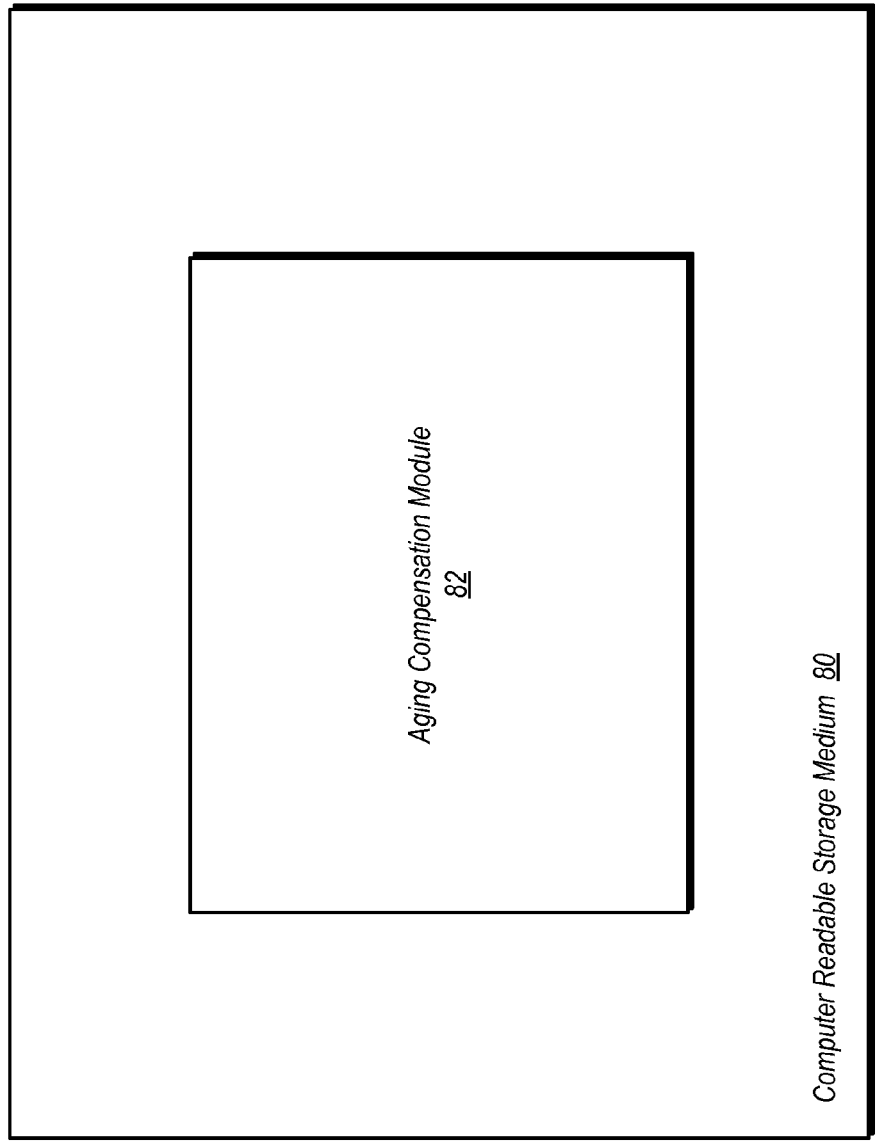
FIG. 9 is a block diagram of one embodiment of a computer readable storage medium storing instructions for implementing age compensation in an IC.

Computer Readable Medium for Software Implementation:

FIG. 9 is a block diagram of one embodiment of a computer readable storage medium storing instructions for implementing age compensation in an IC. In the embodiment shown, computer readable storage medium 80 stores various digital information, including instructions and data to implement aging compensation module 82. In various embodiments, the instructions and data of aging compensation module 82 may implement portions of the aging compensation methods described above. The aging compensation module may be the power control unit 15 illustrated in FIG. 1. For example, aging compensation module 82 may include instructions that may be executed on a computer system to read (e.g., from a register) indications of aging, and to determine the aging based on the indications and a corresponding desired operating voltage. Instructions of aging compensation module may also be executable to compare the desired operating voltage to a present operating voltage, and to cause information indicating an updated operating voltage to be written into a non-volatile memory. The instructions may also be executable to change the operating voltage of the IC during its operation, prior to the next start-up sequence. In addition, instructions stored in aging compensation module may cause the non-volatile memory to be read during a subsequent start-up sequence to determine the voltage at which the IC is to be operated.

Some instructions may be exclusive to a first time (i.e. initial) start-up of the IC. For example, instructions may be included that cause the reading of fuses to determine an initial, beginning-of-life operating voltage for the IC, which may be executed in conjunction with instructions to write this voltage to the non-volatile memory.

Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link. The computer accessible storage medium 50 in FIG. 9 may store the aging compensation module 82, which may implement one or more of the flowcharts shown in FIGS. 5, 6, 7, and 8 (or portions thereof). Generally, the computer accessible storage medium 200 may store any set of instructions which, when executed, implement a portion or all of the flowcharts shown in FIGS. 5, 6, 7, and 8. A carrier medium may include computer accessible storage media as well as transmission media such as wired or wireless transmission.

Figure 10:
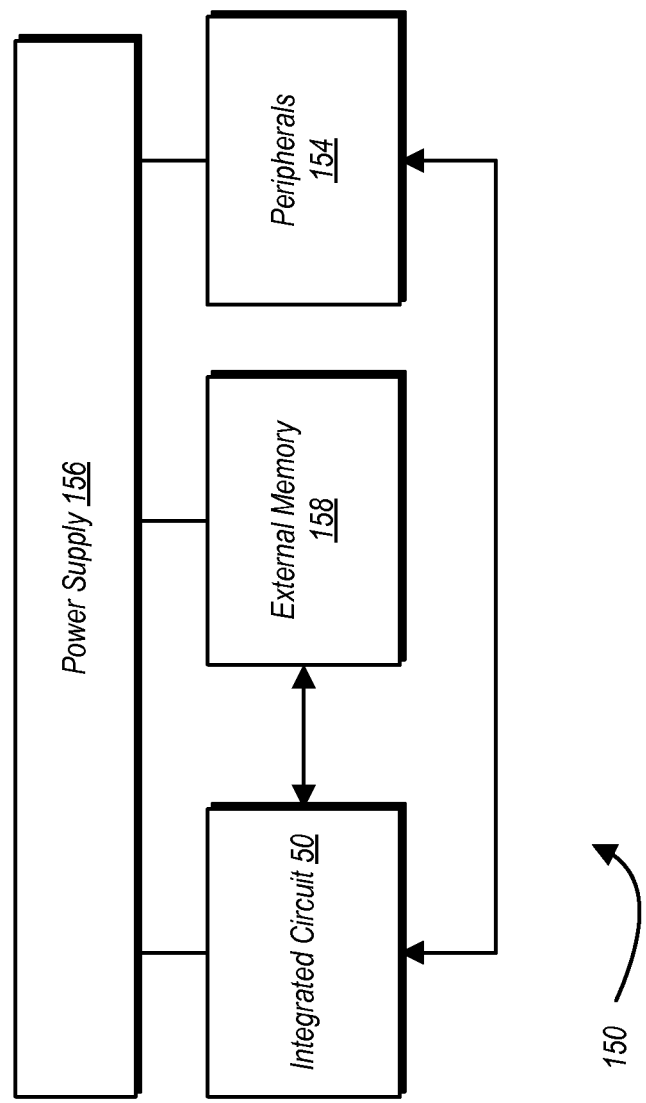
FIG. 10 is a block diagram of one embodiment of a system including the integrated circuit shown in FIG. 1.

Exemplary System:

Turning next to FIG. 10, a block diagram of one embodiment of a system 150 is shown. In the illustrated embodiment, the system 150 includes at least one instance of an IC 50 (from FIG. 5) coupled to one or more peripherals 154 and an external memory 158. A power supply 156 is also provided which supplies the supply voltages to the IC 50 as well as one or more supply voltages to the memory 158 and/or the peripherals 154. Thus, the power supply 156 may include the voltage regulator 18 shown in FIG. 1. In some embodiments, more than one instance of the IC 50 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
reading, from a non-volatile memory, information indicative of the first operating voltage during a first system start-up sequence subsequent to an initial start-up sequence;
operating an integrated circuit (IC) at a first operating voltage;
writing, to the non-volatile memory and responsive to determining that the aging of the IC is greater than or equal to a first aging threshold, information indicative of a second operating voltage;
reading the information indicative of the second operating voltage during a second start-up sequence, the second start-up sequence being subsequent to the first start-up sequence; and
operating the IC at a second operating voltage responsive to responsive to reading the information indicative of the second operating voltage, wherein the second operating voltage is greater than the first operating voltage.

2. The method as recited in claim 1, further comprising:
monitoring the aging of the IC subsequent to operating the IC at the second operating voltage;
determining if the aging of the IC is greater than or equal to a second aging threshold;
operating the IC at a third operating voltage responsive to determining that the aging of the IC is greater than or equal to the second aging threshold, wherein the third operating voltage is greater than the second operating voltage.

3. The method as recited in claim 1, further comprising continuing operation of the IC at the first operating voltage responsive to determining that the aging of the IC is less than the first aging threshold.

4. The method as recited in claim 1, further comprising:
reading, from a non-volatile memory, information indicative of the first operating voltage during a first system start-up sequence subsequent to an initial start-up sequence;
operating the IC at the first operating voltage;
writing information indicative of the second operating voltage to the non-volatile memory responsive to determining that the aging of the IC is greater than or equal to the first aging threshold;
reading the information indicative of the second operating voltage during a second start-up sequence, the second start-up sequence being subsequent to the first start-up sequence; and
operating the IC at the second operating voltage responsive to reading the information indicative of the second operating voltage.

5. The method as recited in claim 1, wherein the first operating voltage of the IC is an initial operating voltage of the IC, and wherein the method further comprises increasing the operating voltage each time the aging of the IC exceeds one of a plurality of aging thresholds.

6. A system comprising:
a power control unit of an integrated circuit (IC) to cause the IC to operate at a first voltage responsive to reading, from a non-volatile memory, information indicative of the first operating voltage during a first start-up sequence; and
one or more aging detection circuits to monitor aging of the IC and coupled to provide indications of aging to the power control unit;
wherein the power control unit to write information indicative of a second operating voltage to the non-volatile memory responsive to determining that the aging of the IC is greater than or equal to the first aging threshold and to cause the IC to operate at a second voltage responsive reading the information indicative of the second operating voltage, from the non-volatile memory, during a second start-up sequence subsequent to the first start-up sequence.

7. The system as recited in claim 6, wherein the power control circuit is to further determine, based on the indications received from the one or more aging detection circuits, if a second aging threshold has been exceeded and to cause the IC to operate at a third voltage responsive to determining that the aging of the IC exceeds a second aging threshold, wherein the third voltage is greater than the second voltage.

8. The system as recited in claim 6, wherein the power control unit is to cause the IC to operate at the first voltage responsive to determining that the aging of the IC is less than the first aging threshold.

9. The system as recited in claim 6, wherein the first voltage is an initial operating voltage, wherein the second voltage is greater than the first voltage, and wherein the power control unit is to increase the operating voltage each time the aging of the IC exceeds one of a plurality of aging thresholds.

10. The system as recited in claim 6, further comprising a voltage regulator coupled to the IC, wherein the power control unit is to provide signals to the voltage regulator to cause the voltage regulator to change from providing the first voltage to providing the second voltage.

11. An integrated circuit comprising:
a power control circuit to read, from a non-volatile memory of the integrated circuit, information indicative of a first operating voltage during a first system start-up sequence subsequent to an initial start-up sequence, and further configured to cause the integrated circuit to operate at the first operating voltage; and
one or more aging circuits to provide, to the power control circuit, indications of aging of the integrated circuit;
wherein the power control circuit is to write information indicative of a second operating voltage to the non-volatile memory responsive to determining that the aging of the IC is greater than or equal to the first aging threshold, and to further cause the integrated circuit to operate at the second operating voltage responsive to reading the information indicative of the second operating voltage during a start-up sequence subsequent to the first start-up sequence.

12. The integrated circuit as recited in claim 11, wherein the second operating voltage is greater than the first operating voltage.

13. The integrated circuit as recited in claim 11, wherein the power control circuit is to determine that the first aging threshold has not been exceeded responsive to receiving aging indications at a first logic state from each of the one or more aging circuits, and further configured to determine that the first aging threshold has been exceeded based on receiving aging indications at a second logic state from at least one of the one or more aging circuits.

14. The integrated circuit as recited in claim 11, wherein the integrated circuit includes a plurality of aging circuits to each provide a respective signal at a second logic state responsive to detecting a corresponding amount of aging has occurred, and wherein an amount of aging indicated by each of the aging circuits when its corresponding signal provided at the second logic state is unique with respect to that indicated by each of the other aging circuits.

15. The integrated circuit as recited in claim 14, wherein the power control circuit is to determine that the first aging threshold has been exceeded based on an aggregation of aging indications received from the plurality of aging circuits.

\* \* \* \* \*